(12) United States Patent
Wu et al.

(10) Patent No.: US 11,735,651 B2
(45) Date of Patent: *Aug. 22, 2023

(54) FINFET DEVICE AND METHOD

(71) Applicant: Taiwan Semiconductor Manufacturing Co., Ltd., Hsinchu (TW)

(72) Inventors: Chung-Shu Wu, Taoyuan (TW); Ying-Ya Hsu, Hsinchu (TW); Ching-Yu Pan, Kaohsiung (TW); Hsiu-Hao Tsao, Taichung (TW); An Chyi Wei, Hsinchu (TW); Yuan-Hung Chiu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/872,531

(22) Filed: Jul. 25, 2022

(65) Prior Publication Data

US 2022/0359735 A1 Nov. 10, 2022

Related U.S. Application Data

(63) Continuation of application No. 17/113,351, filed on Dec. 7, 2020, now Pat. No. 11,437,498, which is a
(Continued)

(51) Int. Cl.
*H01L 29/78* (2006.01)
*H01L 21/8234* (2006.01)
(Continued)

(52) U.S. Cl.
CPC .. *H01L 29/66818* (2013.01); *H01L 21/02236* (2013.01); *H01L 21/823431* (2013.01); *H01L 27/0886* (2013.01); *H01L 29/7853* (2013.01)

(58) Field of Classification Search
CPC ........... H01L 29/66818; H01L 29/7853; H01L 29/7854; H01L 21/823431;
(Continued)

(56) References Cited

U.S. PATENT DOCUMENTS 10,861,960 B1 * 12/2020 Wu .................... H01L 21/02238
11,437,498 B2 * 9/2022 Wu ...................... H01L 27/0886
(Continued)

OTHER PUBLICATIONS

Cheung, Kin P., "Mechanism of Charging Damage During Plasma-Enhanced Silicon Nitride/Oxide Thin-Film Desposition," IEEE Transactions on Device and Materials Reliability, vol. 6, No. 3, Sep. 2006, pp. 448-454.
(Continued)

*Primary Examiner* — Robert G Bachner
*Assistant Examiner* — Molly K Reida
(74) *Attorney, Agent, or Firm* — Slater Matsil, LLP

(57) ABSTRACT

A method includes forming a fin on a substrate, forming an insulating material over the fin, recessing the insulating material to form an isolation region surrounding the fin, wherein an upper portion of the fin protrudes above the isolation region, performing a trimming process to reduce a width of the upper portion of the fin, and forming a gate structure extending over the isolation region and the upper portion of the fin.

20 Claims, 24 Drawing Sheets

Related U.S. Application Data continuation of application No. 16/527,284, filed on Jul. 31, 2019, now Pat. No. 10,861,960.

(51) Int. Cl.
*H01L 27/092* (2006.01)
*H01L 29/66* (2006.01)
*H01L 21/02* (2006.01)
*H01L 27/088* (2006.01)

(58) Field of Classification Search
CPC ....... H01L 21/823821; H01L 21/66795; H01L 21/66818; H01L 21/7853; H01L 21/7854
See application file for complete search history.

(56) References Cited

U.S. PATENT DOCUMENTS

2018/0247938 A1* 8/2018 Cheng ............. H01L 21/823821
2019/0371796 A1 12/2019 Zang et al.

OTHER PUBLICATIONS

Description of Old Fin Trim Method, 2 pages.
Frieser, R.G. et al., "Silicon Damage Caused by Hydrogen Containing Plasmas," IBM General Technology Division, Solid-State Science and Technology, Nov. 1983, vol. 130, No. 11, pp. 2237-2241.
Srour, J.R., et al., "Review of Displacement Damage Effects in Silicon Devices," IEEE Transactions on Nuclear Science, vol. 50, No. 3, Jun. 2003, pp. 653-670.
Szymasnski, M.A., et al., "The Different Roles of Charged and neutral Atomic and Molecular Oxidising Species in Silicon Oxidation From AB Initio Calculations," Pergaman, Solid-State Electronics, Apr. 3, 2000, pp. 1233-1240.
Xu, Jiazhan et al., "Enhanced Silicon Oxide Film Growth on Si (100) Using Electron Impact," Journal of Applied Physics, Dec. 15, 1997, vol. 82, Issue 12, pp. 6289-6292.

* cited by examiner

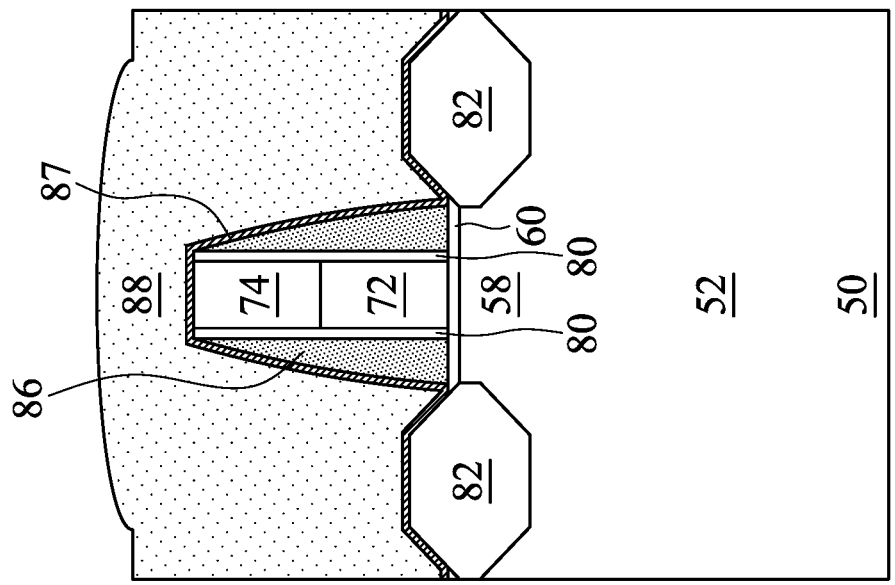
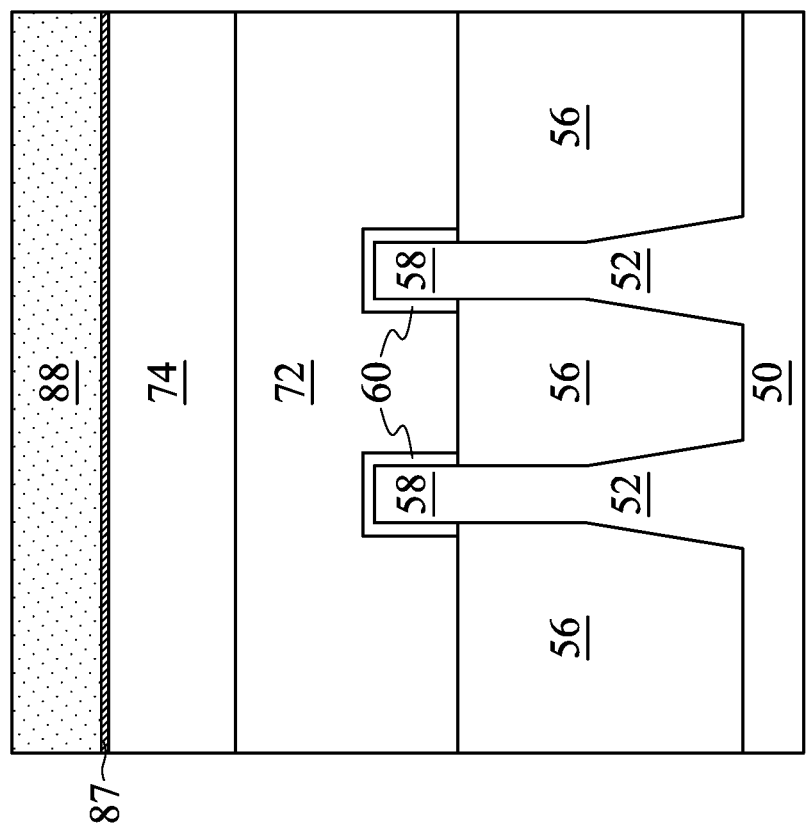
Figure 13A
Figure 13B

FINFET DEVICE AND METHOD

PRIORITY CLAIM AND CROSS-REFERENCE

This application is a continuation of U.S. patent application Ser. No. 17/113,351, filed on Dec. 7, 2020, now U.S. Pat. No. 11,437,498, issued Sep. 6, 2022, which is a continuation of U.S. patent application Ser. No. 16/527,284, filed on Jul. 31, 2019, now U.S. Pat. No. 10,861,960 issued Dec. 8, 2020, each application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9, 10A, 10B, 11A, 11B, 12A, 12B, 12C, 12D, 13A, 13B, 14A, 14B, 15A, 15B, 16A, 16B, 16C, 17A, 17B, 18A, and 18B are cross-sectional views of intermediate stages in the manufacturing of FinFETs, in accordance with some embodiments.

DETAILED DESCRIPTION

Figure 1:
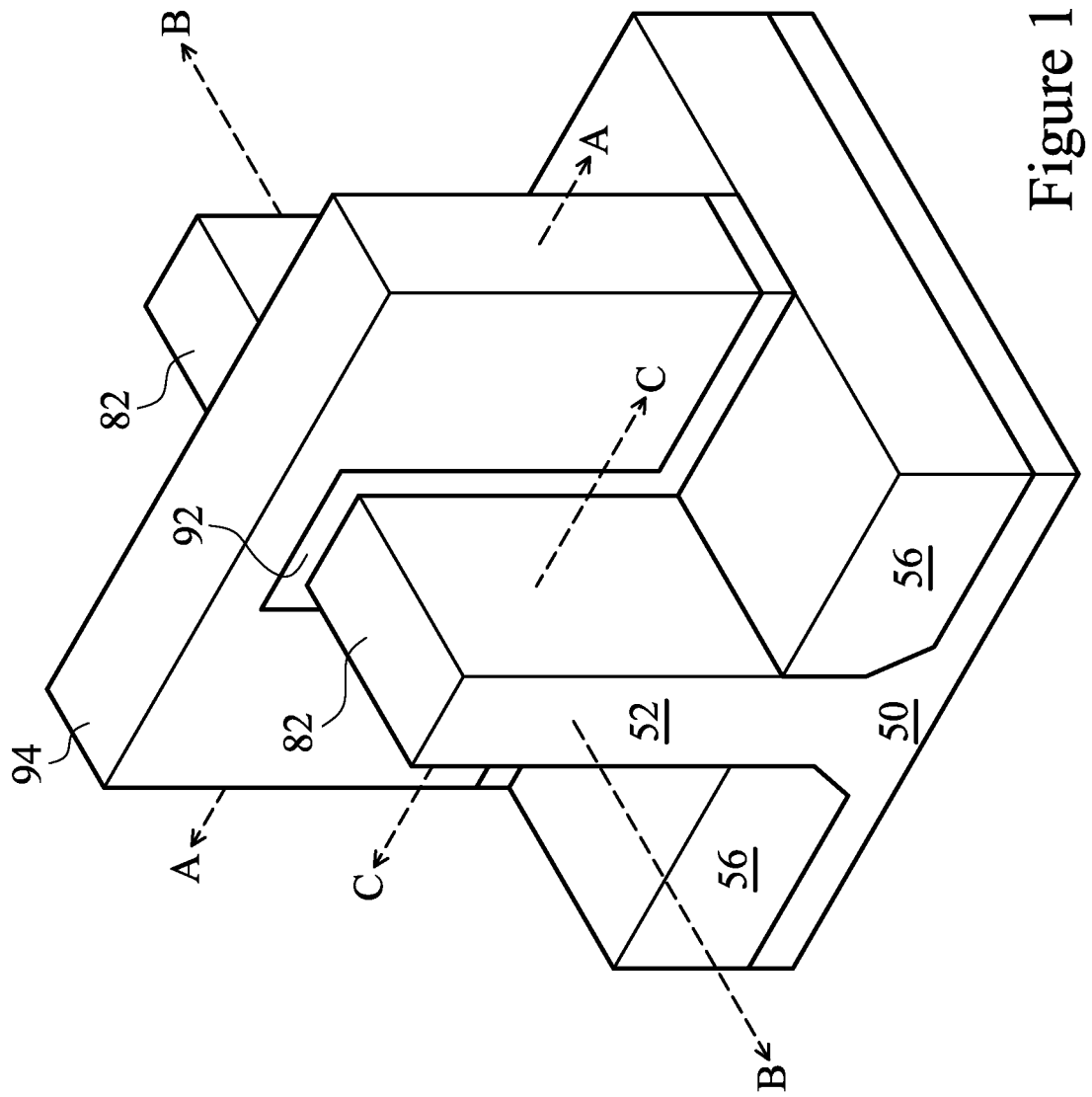
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are discussed herein in a particular context, namely, thinning semiconductor fins after forming Shallow Trench Isolation (STI) regions. However, various embodiments may be applied to other semiconductor devices/processes, such as planar transistors. In some embodiments, the thinning reduces the width of the fins. The thinning comprises reducing the width of the fins by oxidizing the fins and then removing the oxide. In some embodiments, the oxidization of the fins is facilitated by irradiating the fins with an electron beam. By controlling the parameters of the electron beam, the amount of width reduction can be controlled.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 18B are cross-sectional views of intermediate stages in the manufacturing of FinFETs, in accordance with some embodiments. FIGS. 2 through 8A-C illustrate reference cross-section A-A illustrated in FIG. 1, except for multiple fins/FinFETs. FIGS. 10A, 11A, 12A, 13A, 14A, 15A, 16A, 17A, and 18A are illustrated along reference cross-section A-A illustrated in FIG. 1, and FIGS. 9B, 10B, 11B, 12B, 13B, 14B, 14C, 15B, 16B, 17B, and 18B are illustrated along a similar cross-section B-B illustrated in FIG. 1, except for multiple fins/FinFETs. FIGS. 12C and 12D are illustrated along reference cross-section C-C illustrated in FIG. 1, except for multiple fins/FinFETs.

Figure 2:
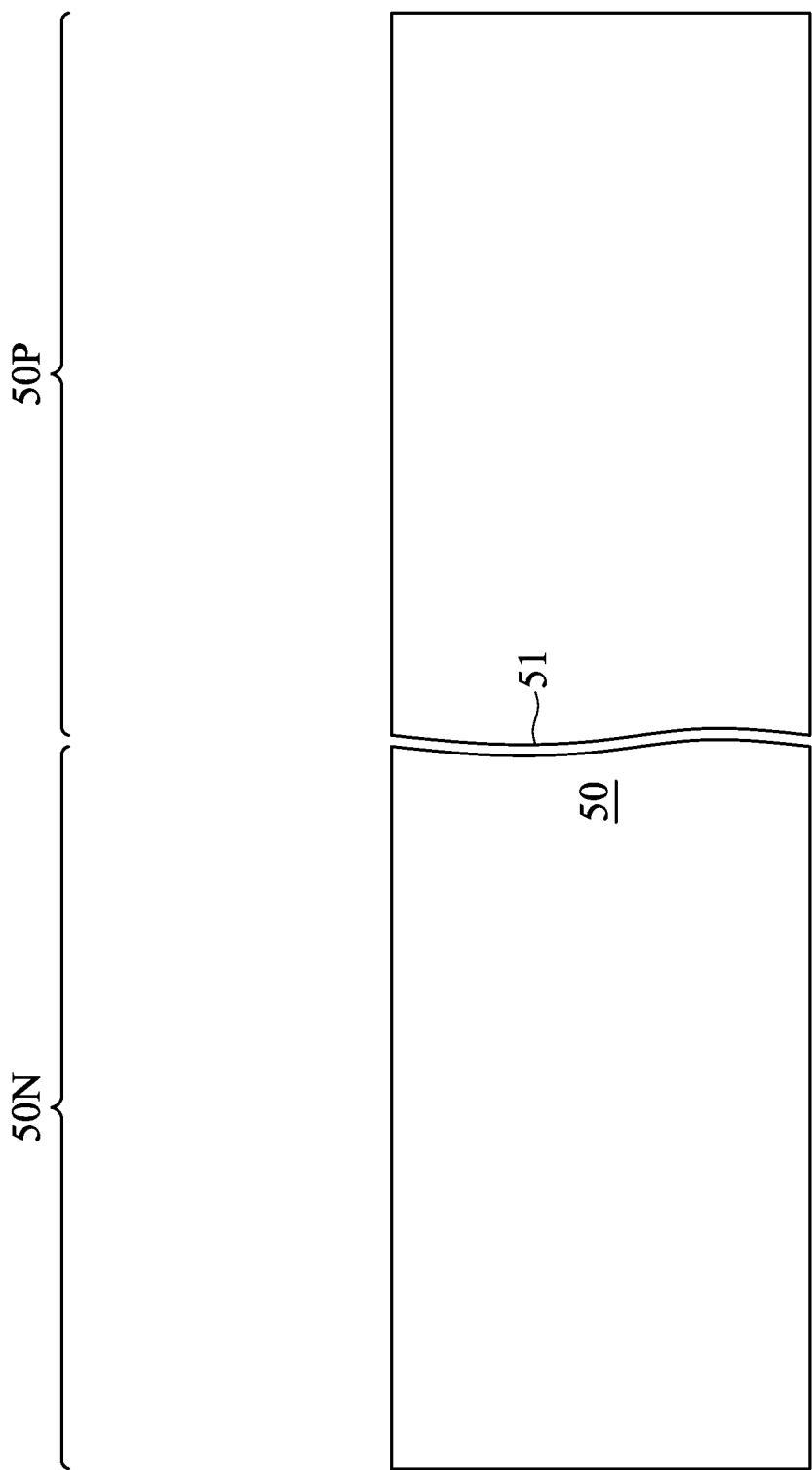
FIGS. 2, 3, 4, 5, 6 are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
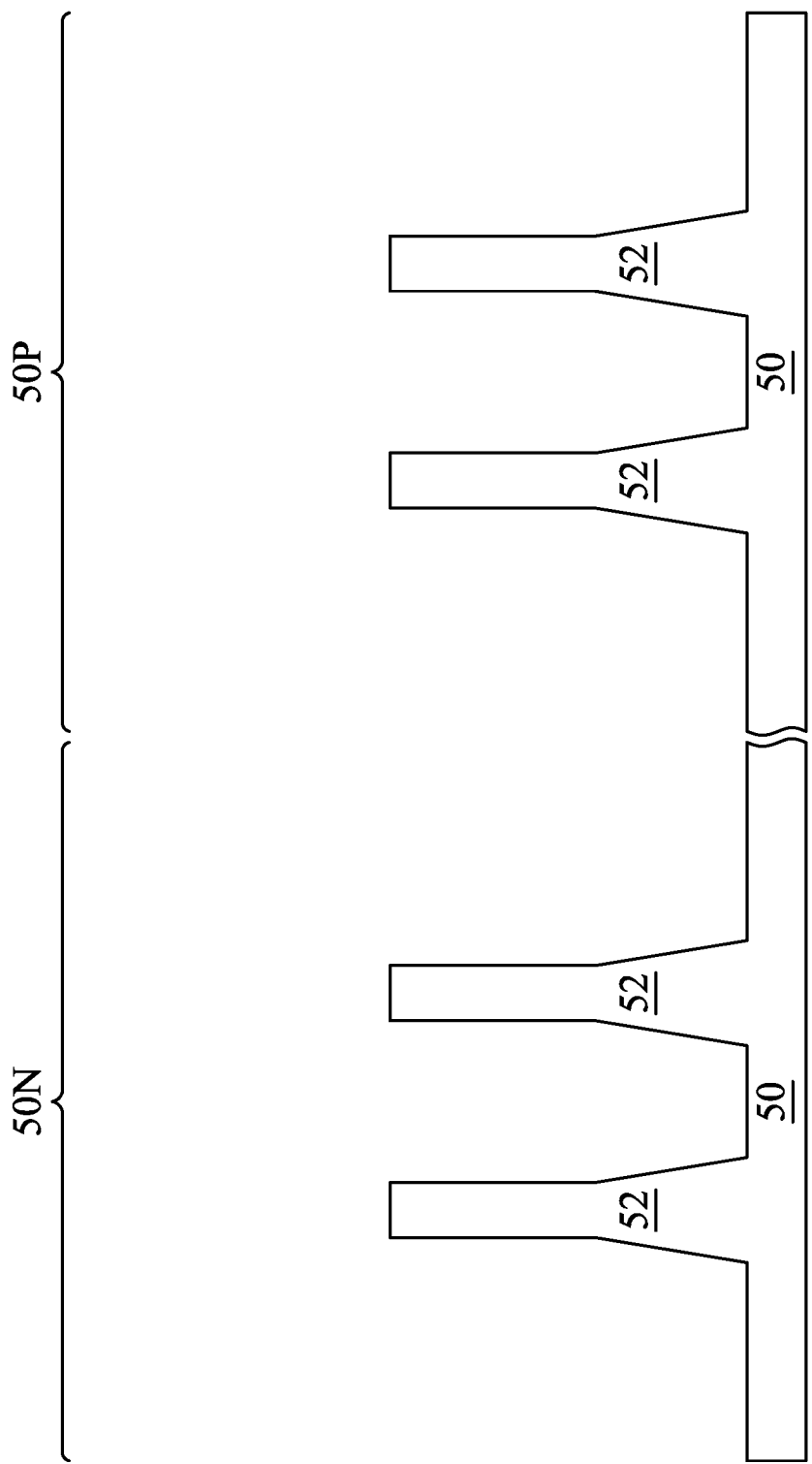

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
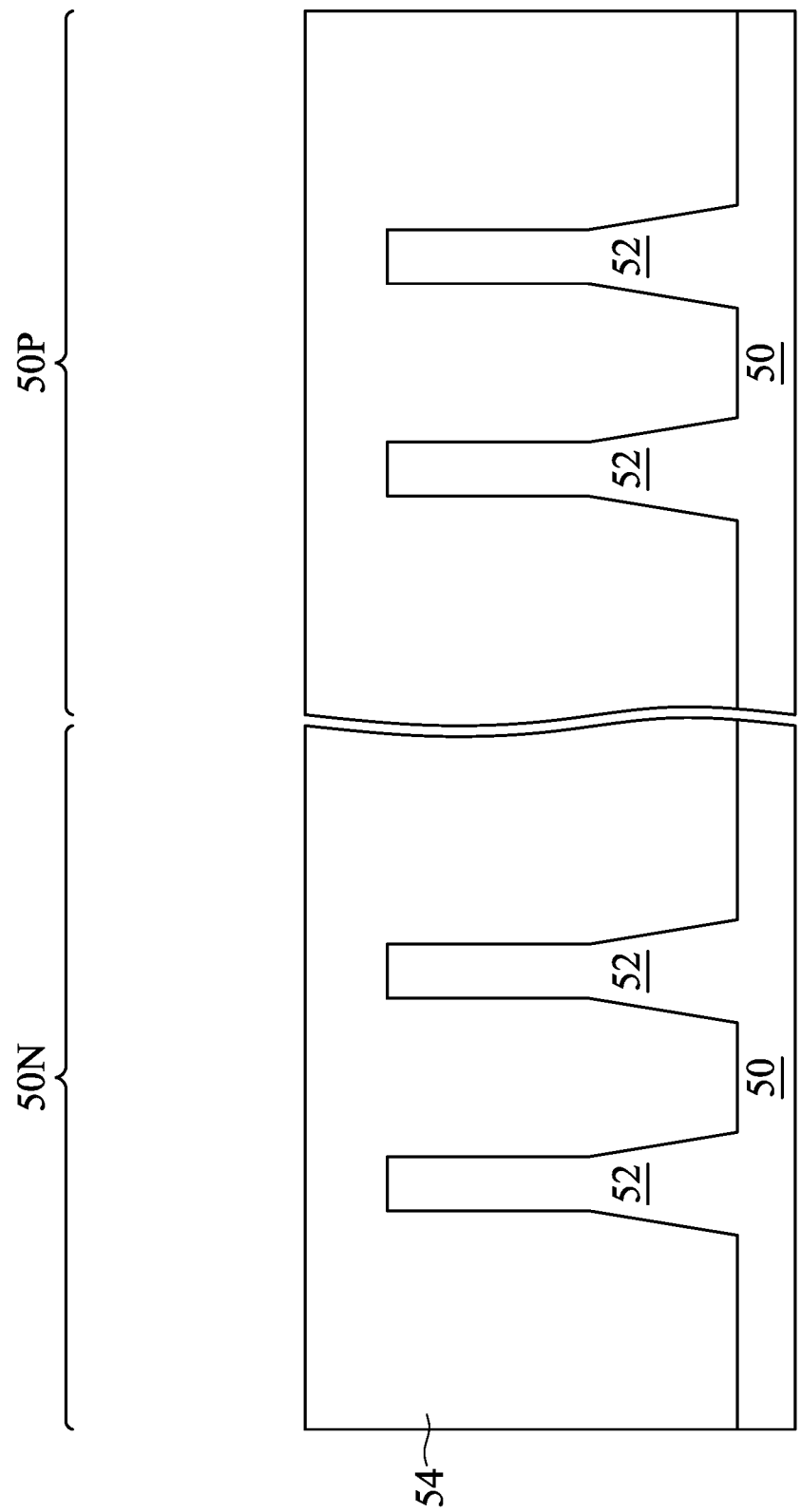

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52.

Although the insulation material 54 is illustrated as a single layer, some embodiments may utilize multiple layers. For example, in some embodiments, a liner may first be formed along a surface of the substrate 50 and the fins 52. An example liner is shown as liner 53 in FIGS. 7A-C and 8A-C, but omitted in other Figures for clarity. After forming the liner, a fill material, such as those discussed above, may be formed over the liner. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, or the like. The formation of the liner may include any suitable method, such as ALD, CVD, HDP-CVD, PVD, a combination thereof, or the like. In such embodiments, the liner may prevent (or at least reduce) the diffusion of the semiconductor material from the fins 52 (e.g., Si and/or Ge) into the surrounding insulation material 54 during the subsequent annealing of the insulation material 54. For example, after the insulation material 54 is deposited, an annealing process may be performed on insulation material 54.

Figure 5:
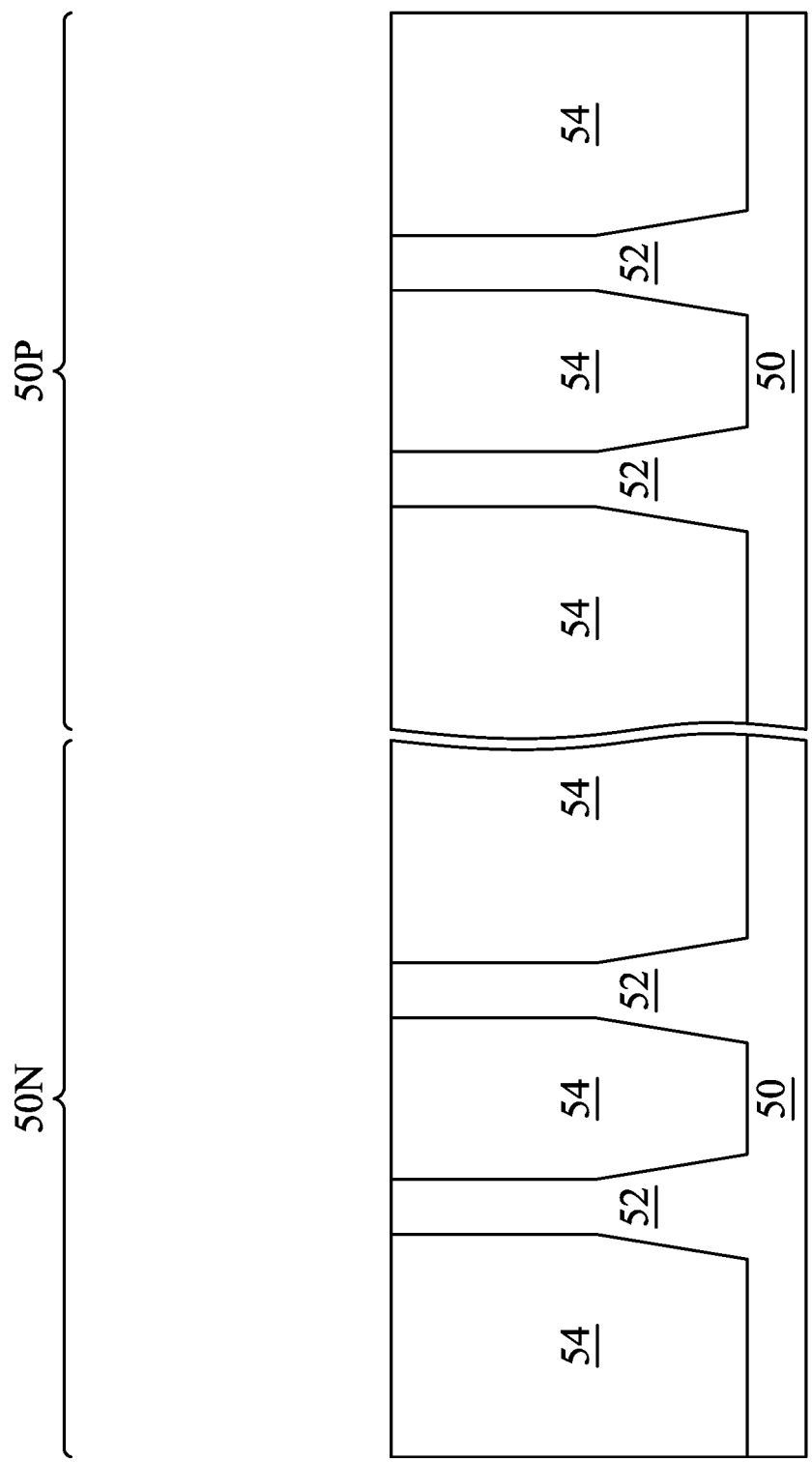

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
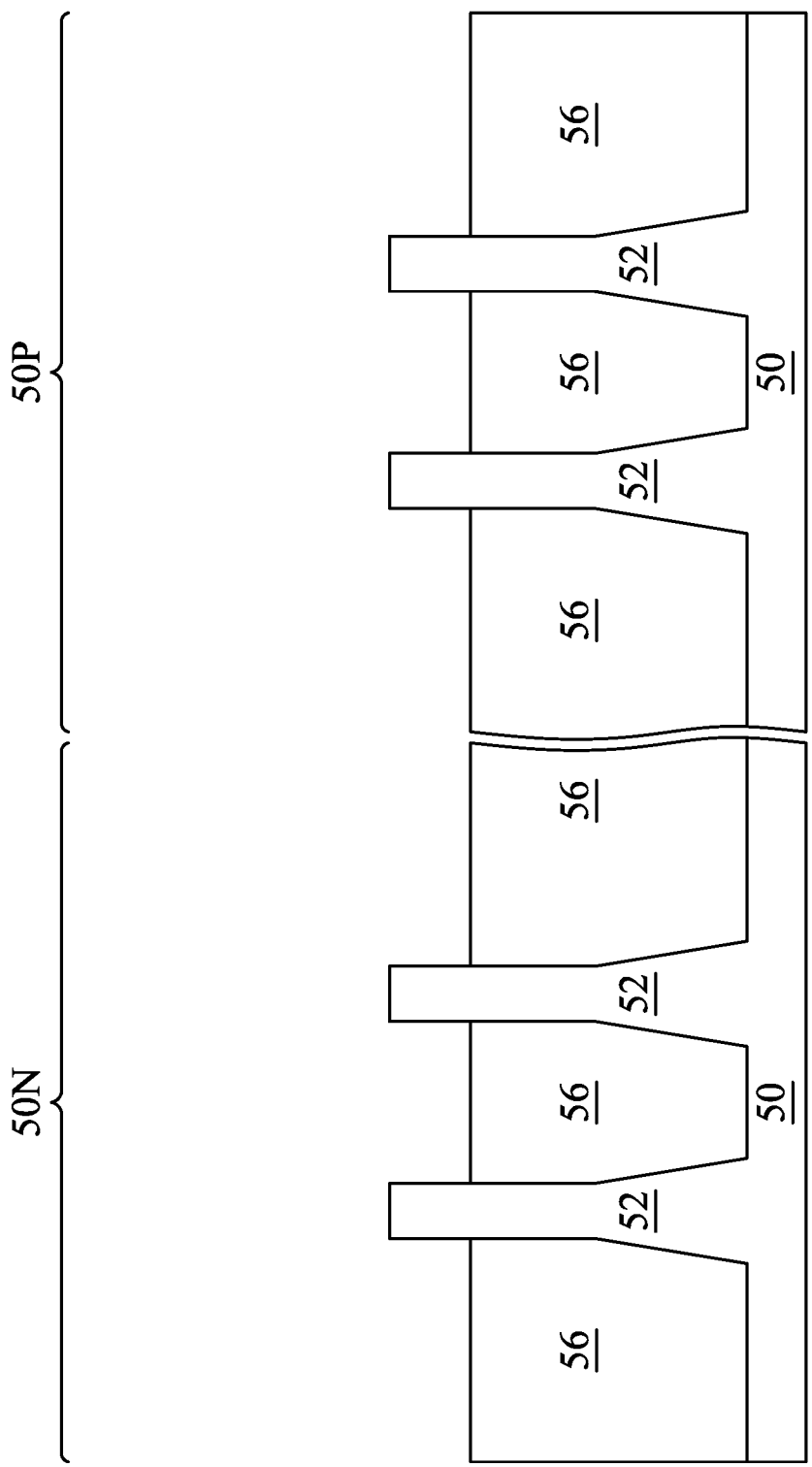

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used. In some embodiments, the fins 52 may protrude above the STI regions 56 a distance between about 45 nm and about 65 nm.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7A:
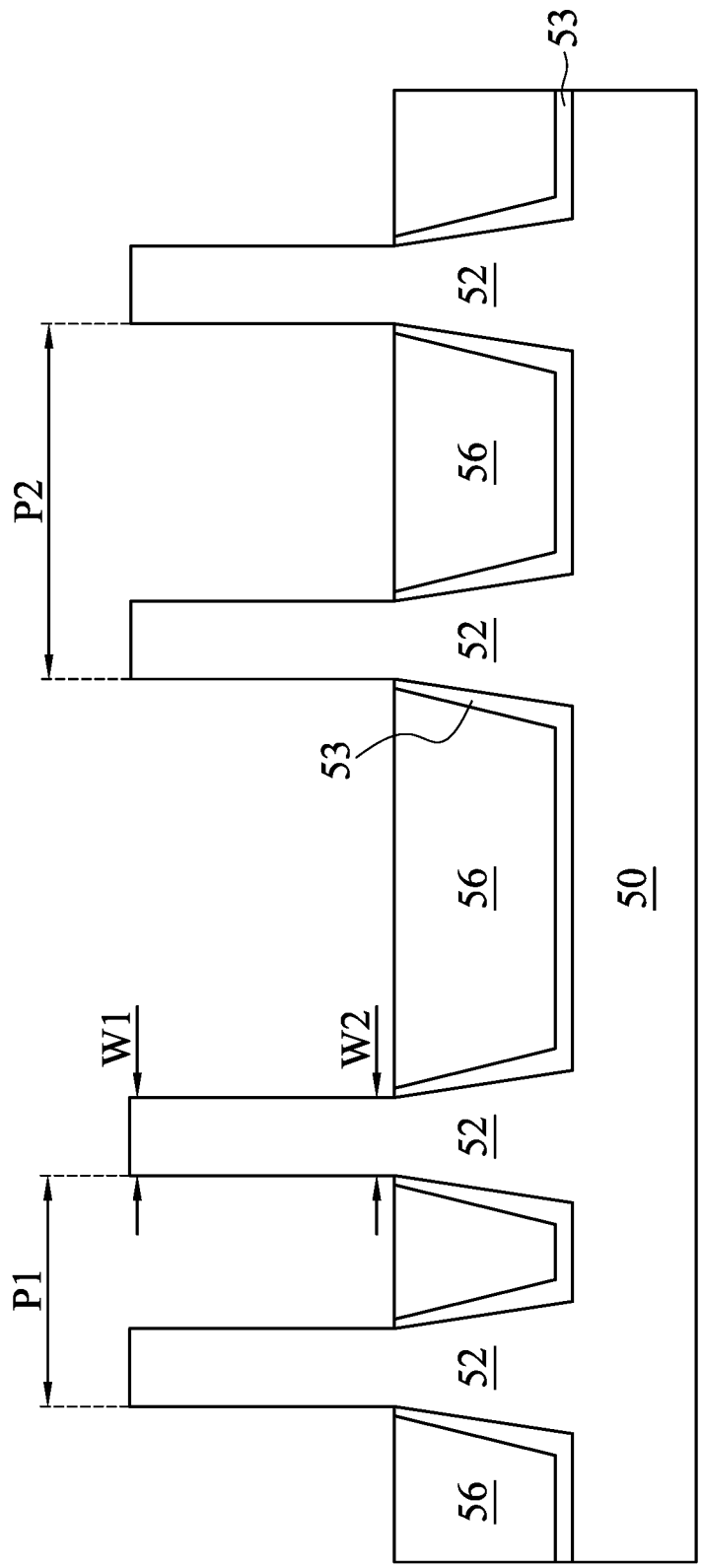
FIGS. 7A, 7B, and 7C are cross-sectional views of intermediate stages in the trimming of fins, in accordance with some embodiments.
Figure 7B:
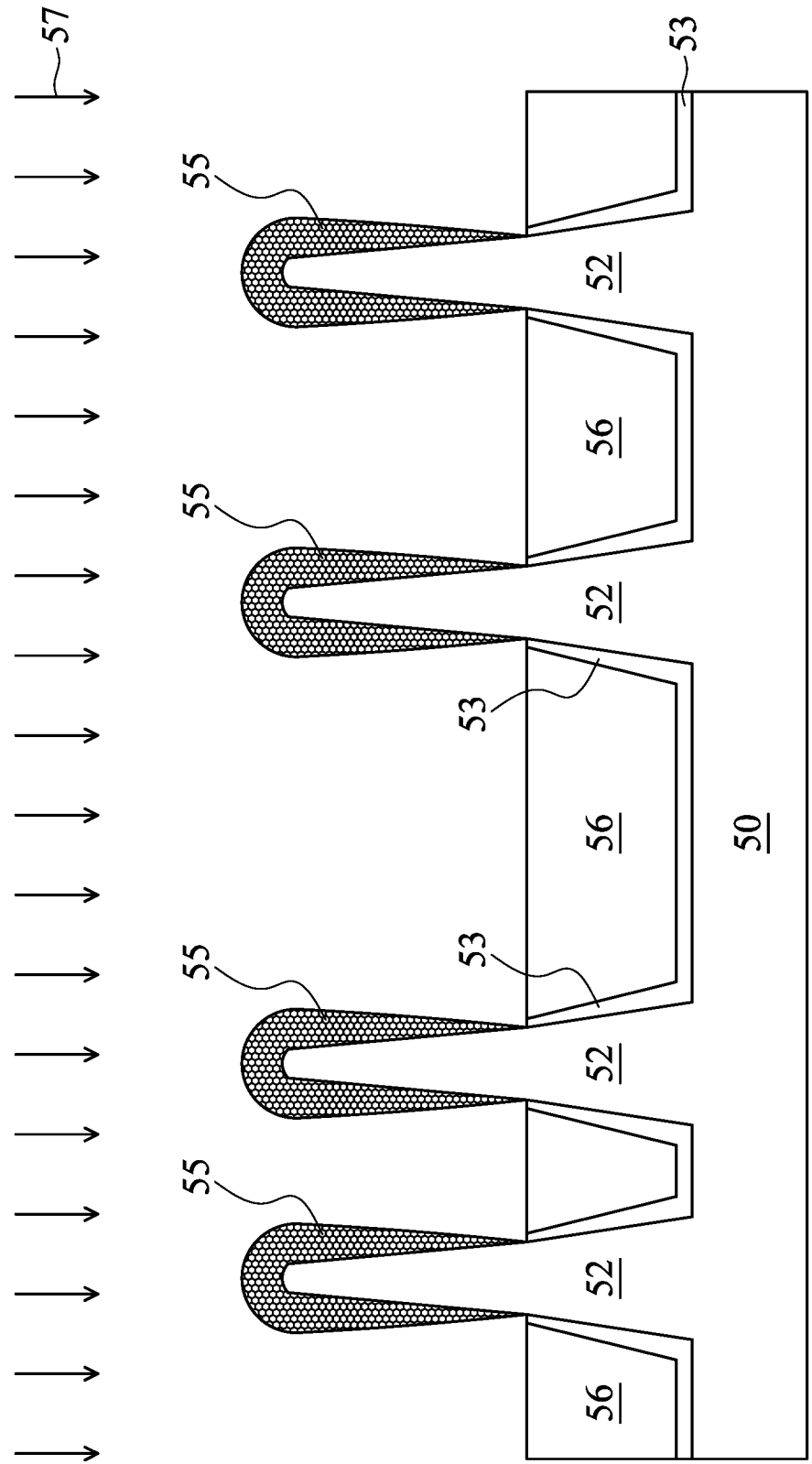
Figure 7C:
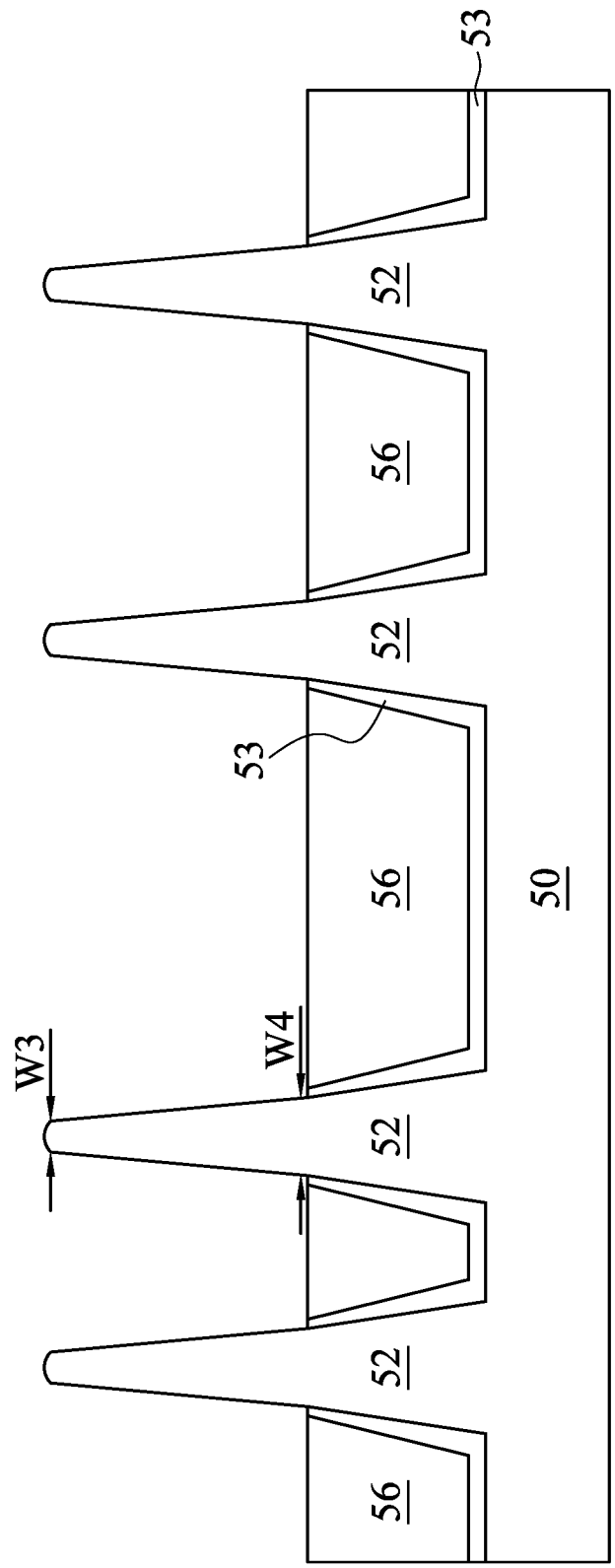

Turning to FIGS. 7A-C, the width of the fins 52 is reduced ("trimmed"), in accordance with some embodiments. FIG. 7A shows a cross-sectional view of several fins 52, which may be similar to the fins 52 shown in FIG. 6, and which may be in region 50N and/or in region 50P. FIG. 7A also shows the liner 53, described above, though in other embodiments the liner 53 is not present. As shown in FIG. 7A, groups of fins 52 may have different pitches, examples of which are indicated by pitch P1 and pitch P2, wherein pitch P1 is smaller than pitch P2. In some embodiments, pitch P1 may be between about 10 nm and about 40 nm and pitch P2 may be between about 20 nm and about 50 nm, though other embodiments may have other pitches than these. As shown in FIG. 7A, a fin 52 may have an upper width W1 and a lower width W2 prior to trimming. In some embodiments, the upper width W1 may be about the same as the lower width W2, or the upper width W1 may be less than the lower width W2. In some embodiments, the upper width W1 may be between about 5 nm and about 9 nm, and the lower width W2 may be between about 5 nm and about 9 nm.

Turning to FIG. 7B, a trimming process 57 is performed on the fins 52. The trimming process 57 (described below) causes exposed outer portions of the fins 52 to oxidize, forming oxide 55. The composition of the oxide 55 depends on the material of the fins 52, and may comprise, for example, a silicon oxide or a silicon germanium oxide. The oxidization of the fins 52 consumes some of the material of the fins 52 as the oxide 55 is produced, which reduces the width of the fins 52. In some embodiments, the amount of oxidation (and thus the amount of trimming) can be controlled by controlling the parameters or conditions of the trimming process 57. In some embodiments, upper portions of the fins 52 are oxidized more than lower portions of the fins 52 during the trimming process 57, and thus more material of the upper portions of the fins 52 is consumed than lower portions of the fins 52. In this manner, after the trimming process 57, the fins 52 may have a tapered profile.

In some embodiments, the trimming process 57 comprises the irradiation of the fins 52 by electrons. In some cases, the impinging electrons create atomic oxygen species (e.g., O, O⁻) from molecular oxygen species (e.g., $O_2$) adsorbed on the surface of the fins 52. In some cases, atomic oxygen species are able to diffuse within the material of the fins 52 more easily than molecular oxygen species, and thus the oxidation of the fins 52 may be increased in regions of the fins 52 irradiated by electrons during the trimming process 57.

In some embodiments, the trimming process 57 may be performed in a processing chamber, and the impinging electrons supplied by an electron beam. In some embodiments, the electron beam is generated by an electron source (e.g., an electron gun or the like), then collimated or focused toward the workpiece (e.g., the structure comprising the substrate 50, fins 52, and other features) using assorted magnetic lenses. Other suitable techniques of generating an electron beam may be used in other embodiments. In some embodiments, the electron beam may be scanned (e.g., rastered) across a region of the workpiece or scanned across the entire workpiece. In some embodiments, the trimming process 57 may be performed using a scanning electron microscope (SEM) or the like. In some embodiments, the electron beam may be focused onto a region of the workpiece such that a certain number of adjacent fins 52 (e.g., one fin 52, two fins 52, or more fins 52) are irradiated at the same time. In some embodiments, the electron beam may be focused to irradiate a region having an area that is between about 10000 $nm^2$ and about 1000000 $nm^2$ on the workpiece.

In some embodiments, the trimming process 57 includes an electron beam having an energy between about 0.5 keV and about 10 keV. In some embodiments, during the trimming process 57, a region of the workpiece may be irradiated for a duration of time that is between about 0.1 seconds and about 2 seconds. In some embodiments, during the trimming process 57, the electron beam may be scanned across the same region of the workpiece more than once, such as two times, three times, ten times, twenty times, more than twenty times, or another number of times. In some embodiments, increasing the energy, number of scans, dose, and/or duration of time of the trimming process 57 can cause more oxidation of the fins 52, and thus reduce the width of the fins 52 more.

In this manner, by controlling the trimming process 57, amount of oxidation of the fins 52 may be controlled to reduce the width of the fins 52 by a desired amount. In some embodiments, the trimming process produces a layer of oxide on the fins 52 that is between about 0.1 nm and about 2.0 nm thick. In some cases, due to the directionality of the electron beam, the upper surfaces of the fins 52 are irradiated more than the lower surfaces of the fins 52, and thus the upper portions of the fins 52 are oxidized more than the lower portions of the fins 52. Consequently, the oxide 55 near the upper portions of the fins 52 may be thicker than the oxide 55 near the lower portions of the fins 52. This may also result in the upper portions of the fins 52 having a smaller width than the lower portions of the fins 52 after the thinning process 57, which may give the fins 52 a tapered profile.

In some embodiments, the trimming process 57 may be performed in a processing chamber having a pressure between about 1E-5 Torr and about 1E-7 Torr. During the trimming process 57, the processing chamber may contain a gas or mixture of gases, such as air, nitrogen, oxygen, argon, other gases, or a combination. In some embodiments, a gas or mixture of gases is flowed into the processing chamber prior to performing the trimming process or while performing the trimming process 57. The gas or mixture of gases flowed into the process chamber may include air, nitrogen, oxygen, argon, other gases, or a combination. In some cases, a small amount of oxygen is present in the processing chamber during the trimming process 57, which facilitates oxidation of the material of the fins 52.

In FIG. 7C, the oxide 55 formed during the trimming process 57 is removed, in accordance with some embodiments. For example, the oxide 55 may be removed using an acceptable etching process, such as one that is selective to the material of the insulation material 54 (e.g., etches the material of the oxide 55 at a faster rate than the material of the fins 52). The oxide 55 may be removed using a wet etching process, a dry etching process, or a combination. For example, an oxide removal using dilute hydrofluoric (dHF) acid may be used.

After removing the oxide 55, the trimmed fins 52 may have a tapered profile, as shown in FIG. 7C. The trimmed fins 52 may have an upper width W3 that is between about 3 nm and about 7 nm and a lower width W4 that is between about 4 nm and about 8 nm. In some embodiments, the width W3 or W4 of the trimmed fins 52 are between about 1 nm and about 4 nm smaller than the width W1 or W2 of the untrimmed fins 52 (see FIG. 7A). In some embodiments, the width W3 is between about 40% and about 80% of the width W1. In some embodiments, the trimming process 57 reduces the width of the fins 52 by between about 20% and about 50%.

The use of the trimming process 57 described above allows for more precise control over the width of the trimmed fins 52. By controlling the width of the fins 52, the properties of the subsequently formed FinFET device can be controlled. For example, by controlling the width of the fins 52, characteristics such as leakage current, on-current, current crowding, threshold voltage, or other characteristics can be controlled. In some cases, thinning the fins 52 after recessing the insulation material 54 can result in the thinned fins 52 within the final FinFET device having less sidewall roughness (e.g., line edge roughness (LER)) than if the fins 52 are thinned prior to forming the insulation material 54. In some cases, the use of the trimming process 57 described above can produce trimmed fins 52 having more uniform widths. For example, loading effects between different regions of fins 52 having different pitches (e.g., pitches P1 or P2 shown in FIG. 7A) or different regions of fins 52 having different densities of fins 52 can be reduced. In some cases, the use of the trimming process 57 can also reduce nonuniformity in trimmed fins 52 due to the fins 52 comprising different materials. For example, the use of the trimming process 57 can provide more uniform trimming between fins 52 comprising silicon and fins 52 comprising silicon germanium.

Figure 8A:
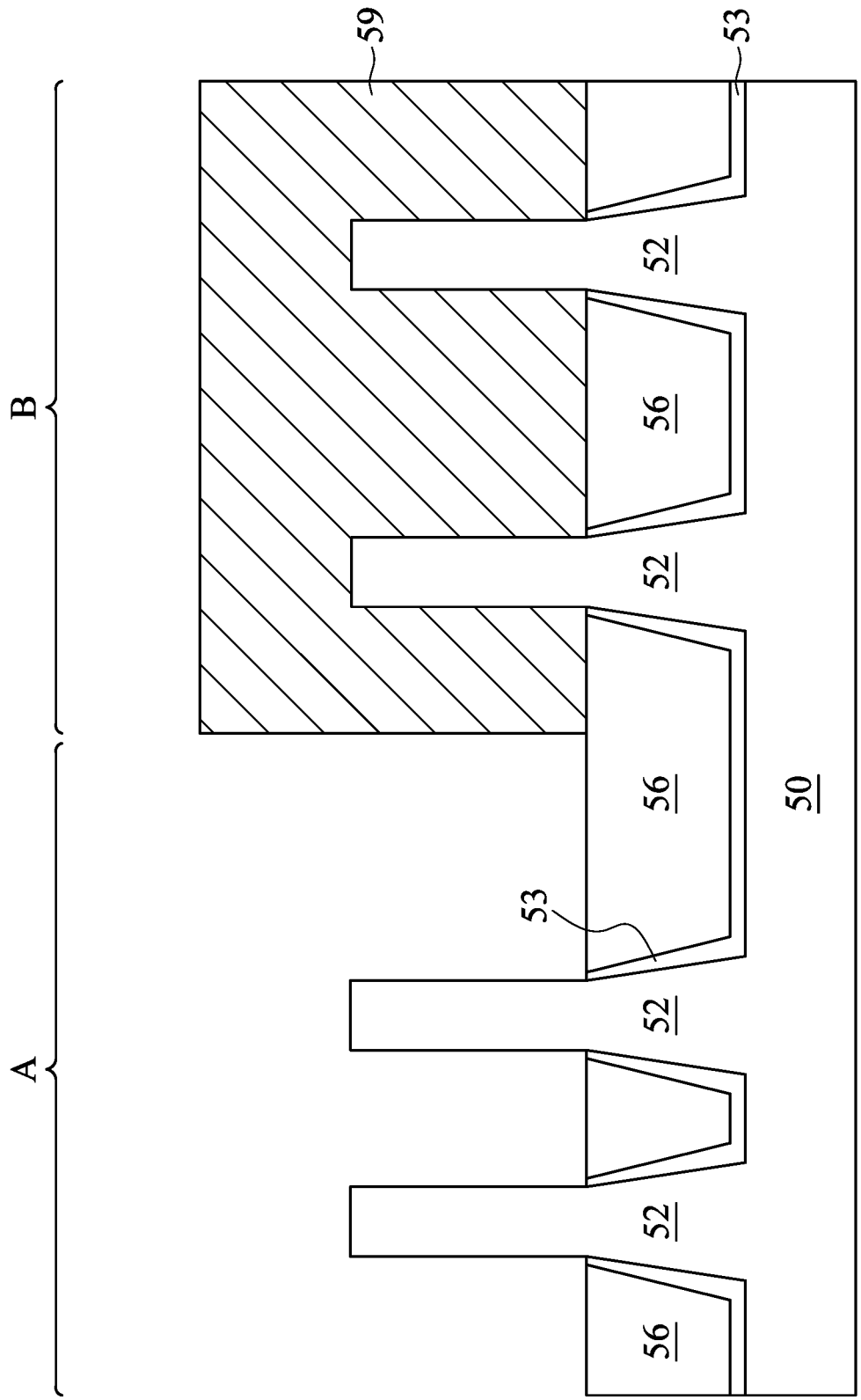
FIGS. 8A, 8B, and 8C are cross-sectional views of intermediate stages in the trimming of fins, in accordance with some embodiments.
Figure 8B:
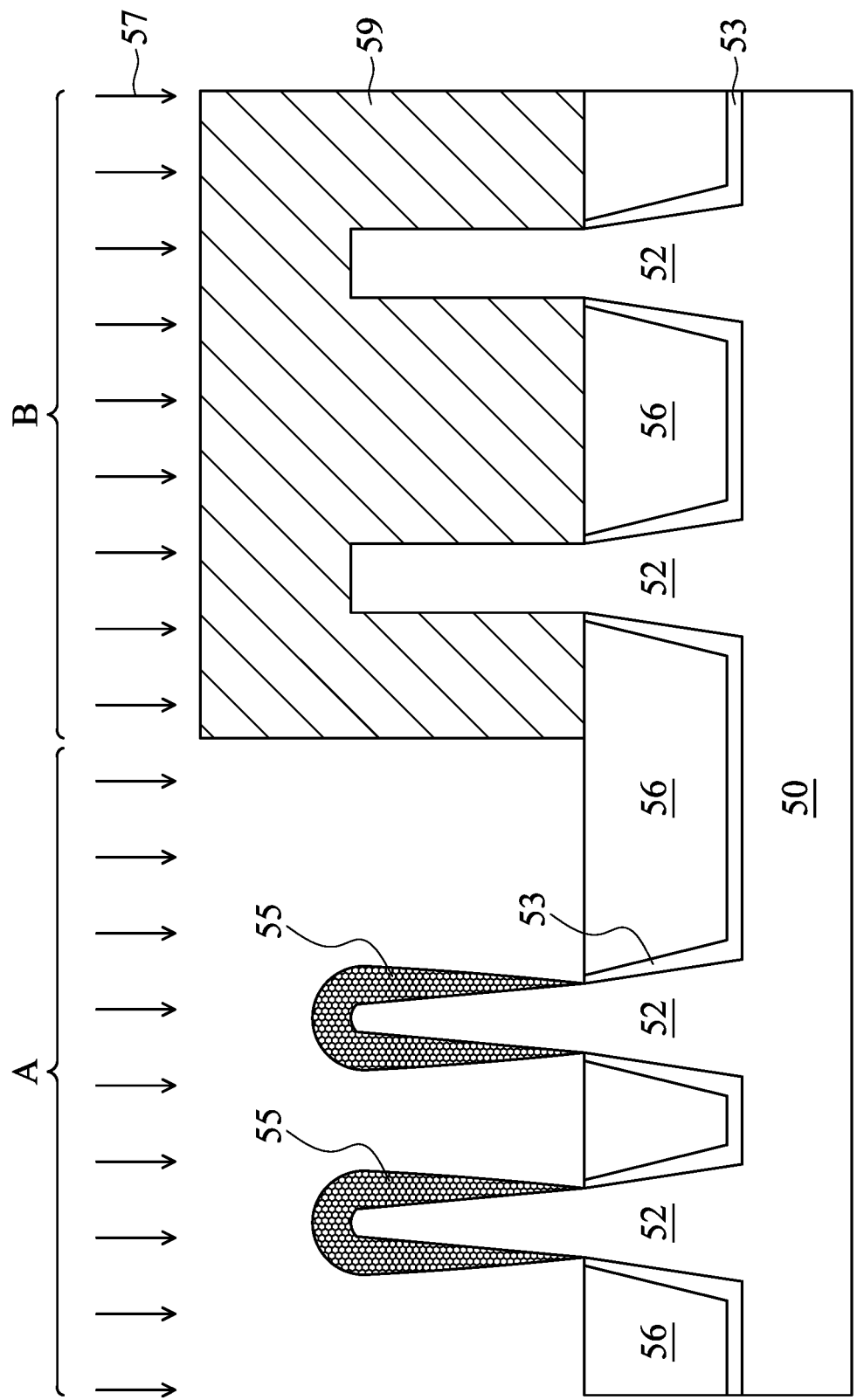
Figure 8C:
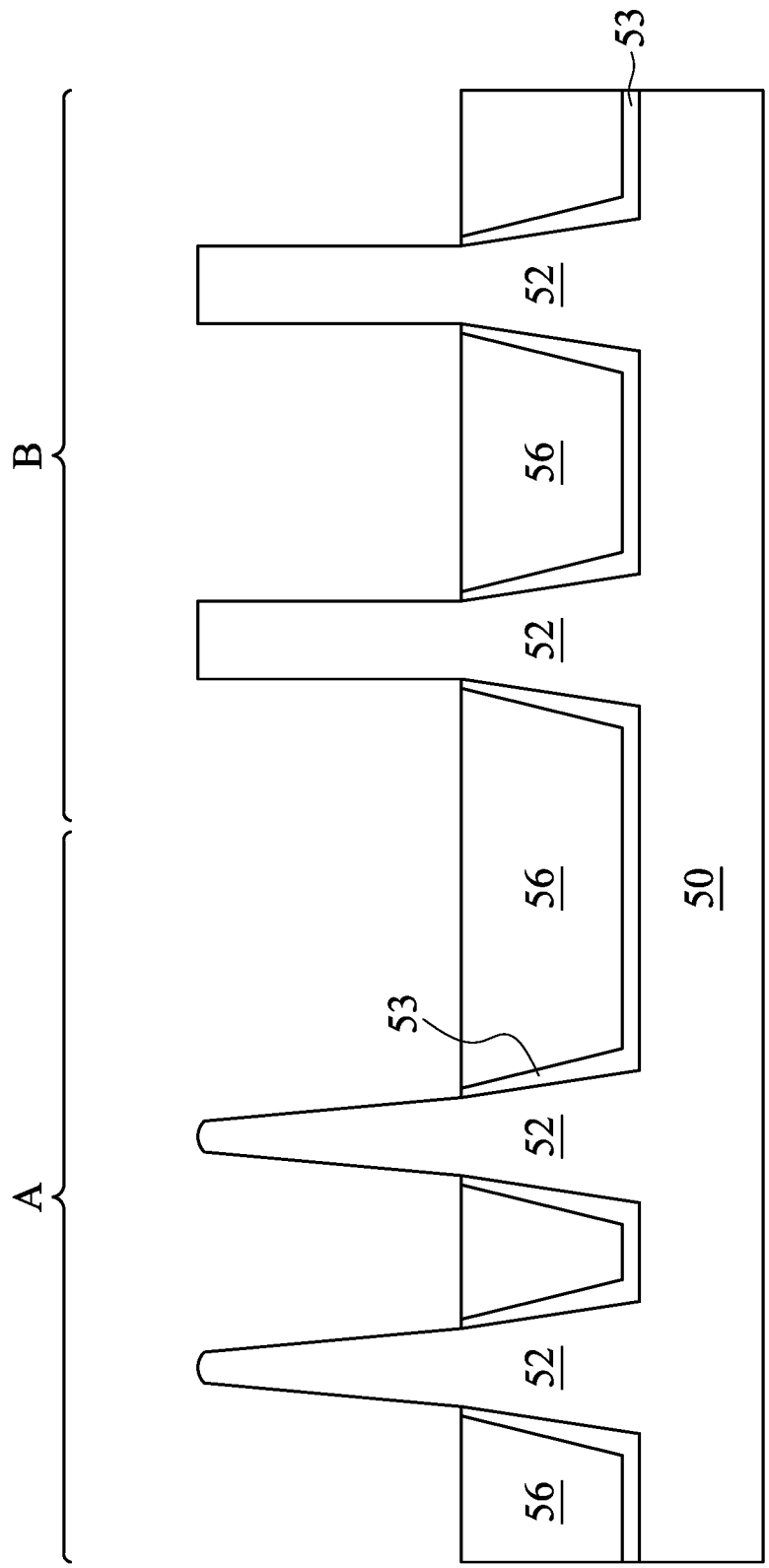

Turning to FIGS. 8A-C, the width of fins 52 is reduced in a particular region, in accordance with some embodiments. FIGS. 8A-C shows a cross-sectional view of several fins 52, which may be similar to the fins 52 shown in FIGS. 7A-C, and which may be in region 50N and/or in region 50P. FIGS. 8A-C also designate a first region A and a second region B, which may be in region 50N and/or in region 50P. FIGS. 8A-C illustrate how a mask 59 may be used to trim fins 52 in the first region A without trimming fins 52 in the second region B.

In FIG. 8A, a mask 59 is formed over the fins 52 in the second region B. The mask 59 may comprise, for example, a single-layer or multiple-layer photoresist structure, a hardmask, or the like. The mask 59 may be formed by forming the material of the mask 59 over the first region A and the second region B, then patterning the material of the mask 59 to remove the material of the mask 59 in the first region A. In FIG. 8B, the trimming process 57 is performed. The trimming process 57 thins the fins 52 in the first region A, as described above in FIG. 7B. The mask 59 blocks the impinging electron beam in the second region B, and thus the fins 52 in the second region B are not trimmed by the trimming process 57. In FIG. 8C, the oxide 55 and the mask 57 are removed, forming trimmed fins 52 in the first region A and untrimmed fins 52 in the second region B. In this manner, fins 52 in different regions of the same device may be formed having different widths. In some embodiments, additional masks may subsequently be formed over regions and additional trimming processes may be performed. In some cases, a trimming process may be performed more than once on one or more fins 52. In this manner, fins 52 having different widths may be formed in multiple regions of a device.

Figure 9:
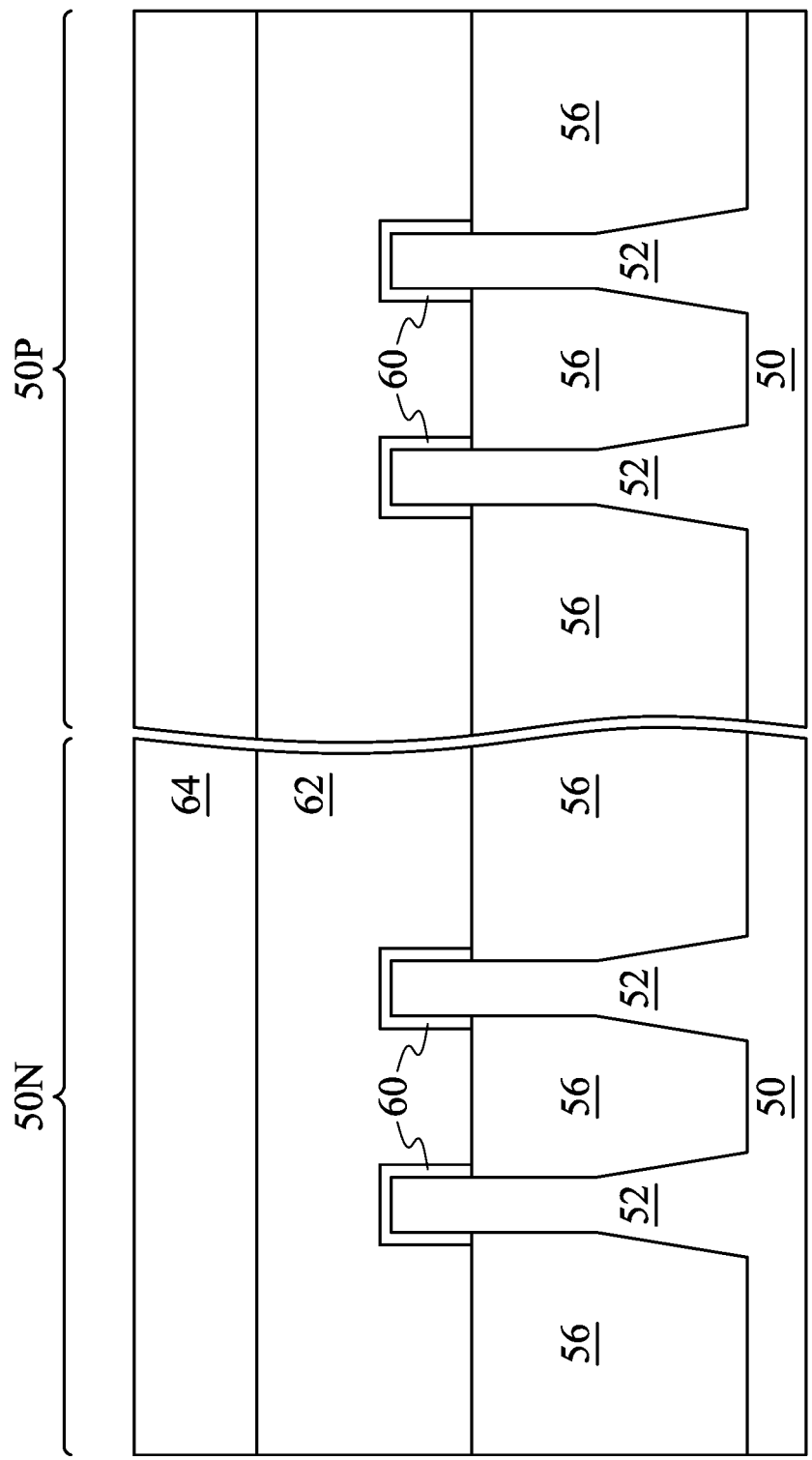

In FIG. 9, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 10A through 18B illustrate various additional steps in the manufacturing of embodiment devices. FIGS. 10A through 18B illustrate features in either of the region 50N and the region 50P. For example, the structures illustrated in FIGS. 10A through 18B may be applicable to both the region 50N and the region 50P. Differences (if any) in the structures of the region 50N and the region 50P are described in the text accompanying each figure.

Figure 10B:
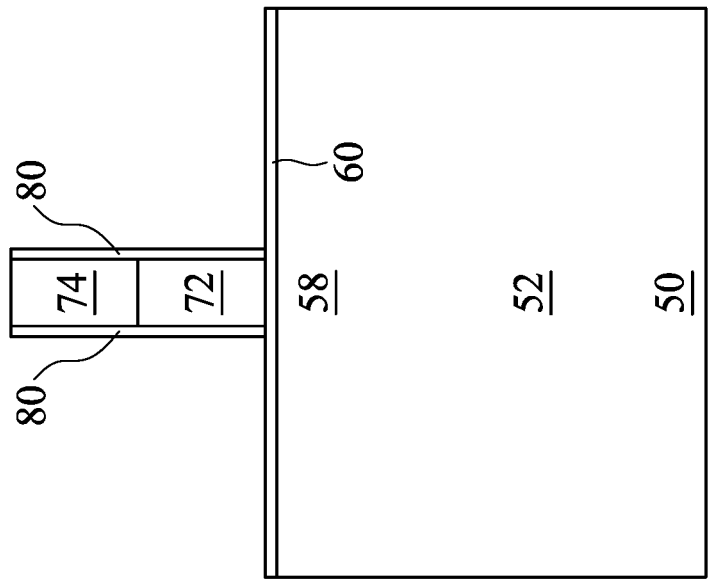
Figure 10A:
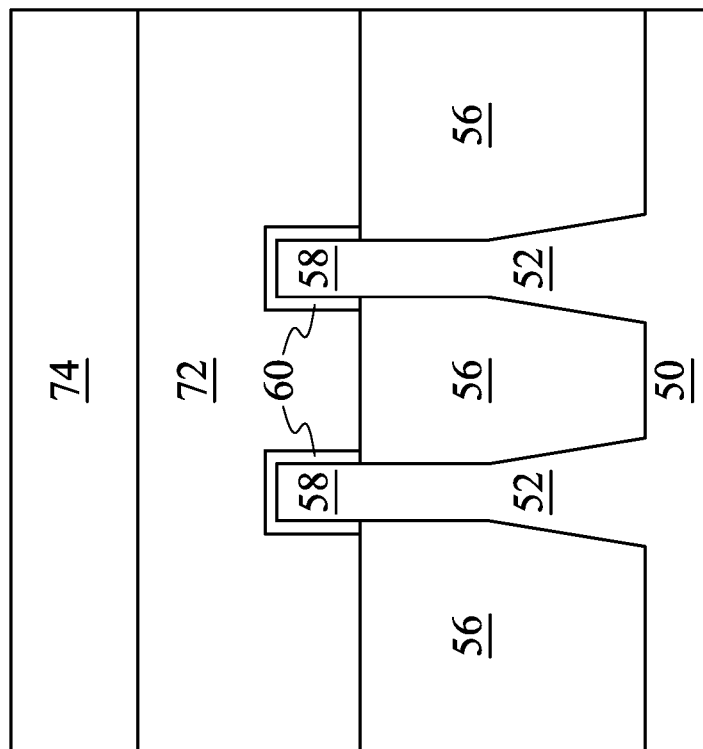

In FIGS. 10A and 10B, the mask layer 64 (see FIG. 9) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 10A and 10B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 11B:
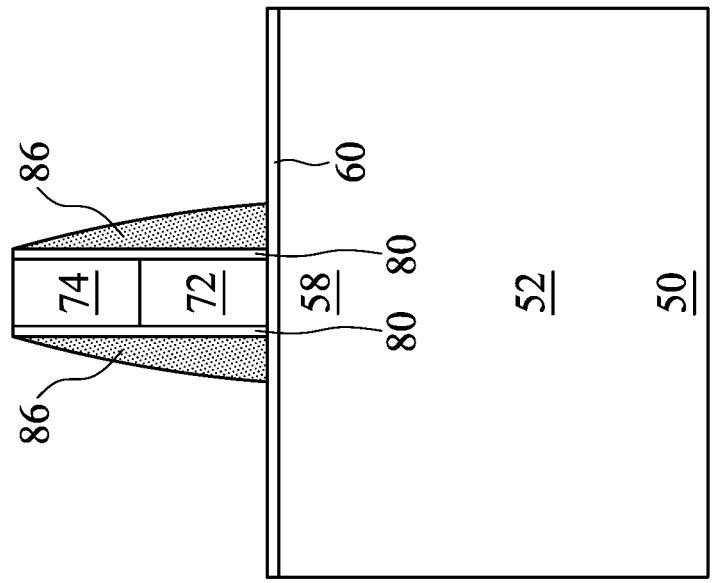
Figure 11A:
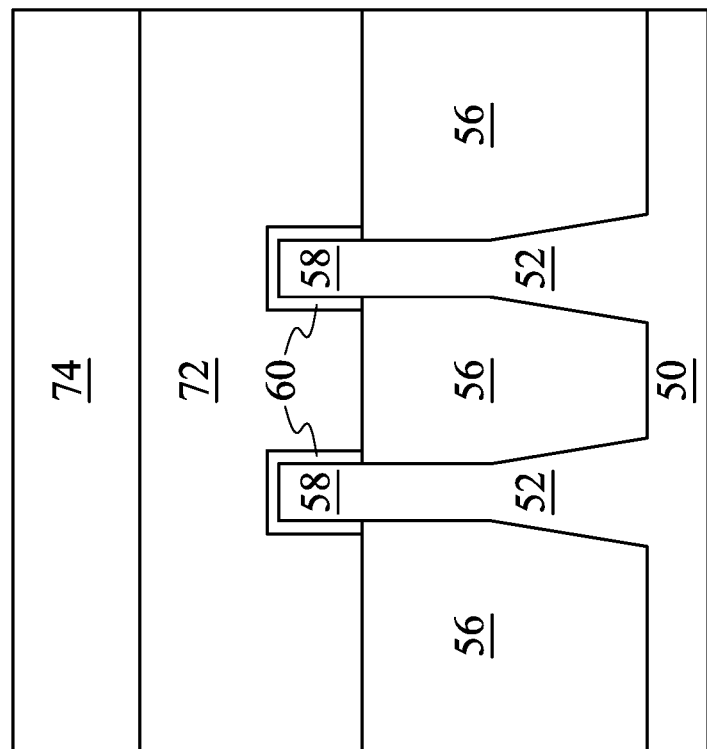

In FIGS. 11A and 11B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 12B:
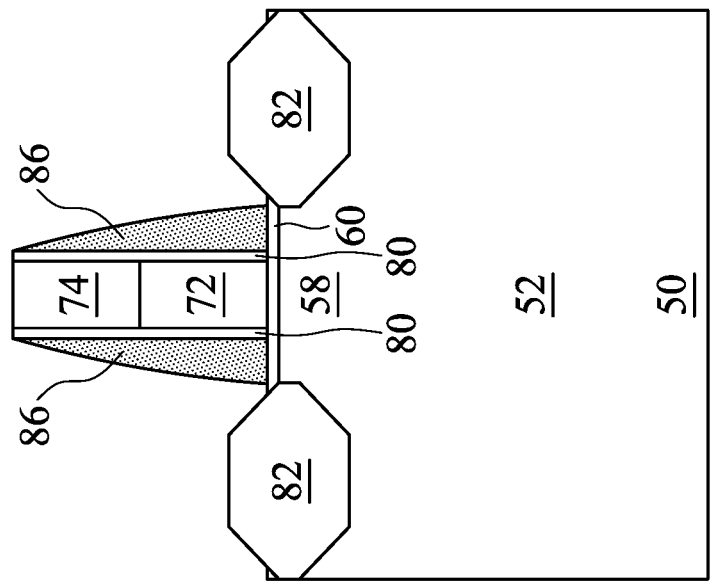
Figure 12A:
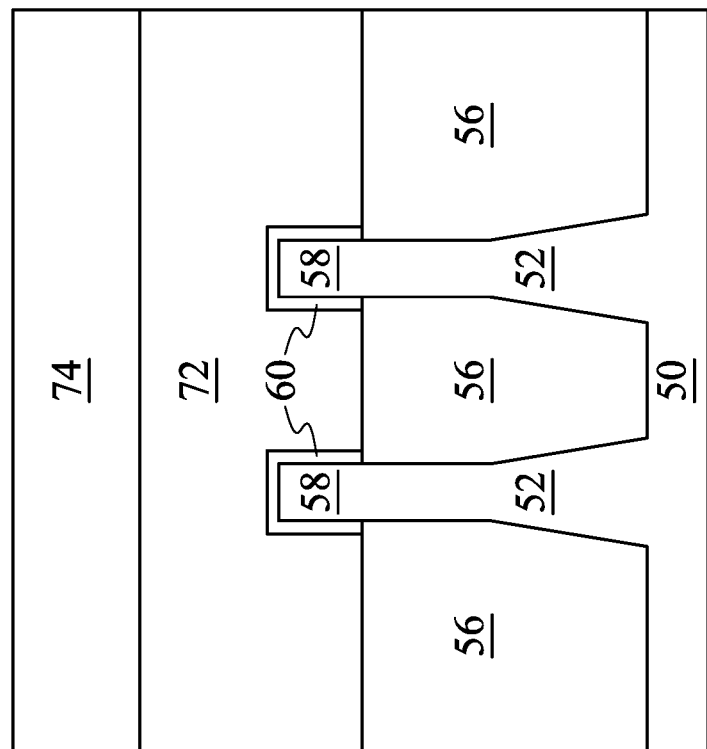
Figure 12C:
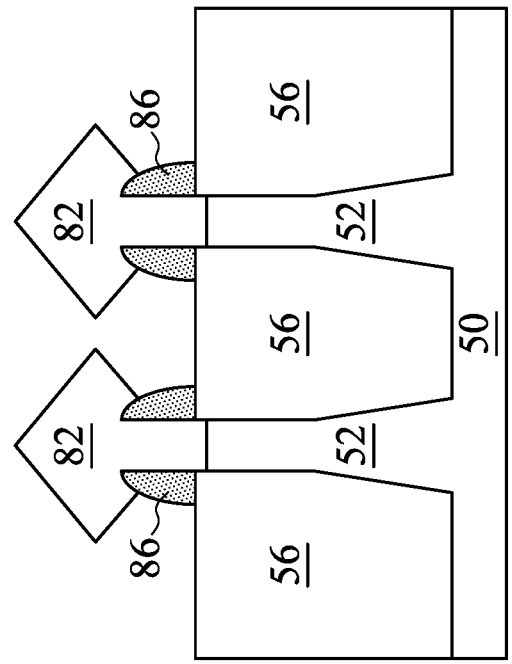
Figure 12D:
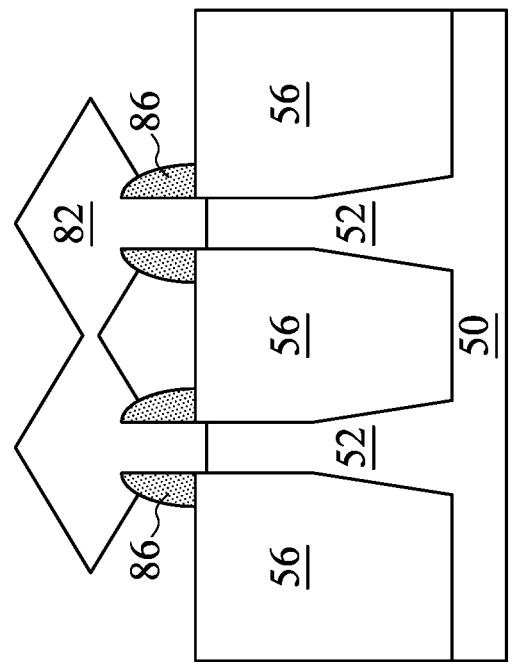

In FIGS. 12A and 12B, epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 12C. In other embodiments, adjacent source/drain regions 82 remain separated after the epitaxy process is completed as illustrated by FIG. 12D. In the embodiments illustrated in FIGS. 12C and 12D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

In FIGS. 13A and 13B, a first interlayer dielectric (ILD) 88 is deposited over the structure illustrated in FIGS. 12A and 12B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 14B:
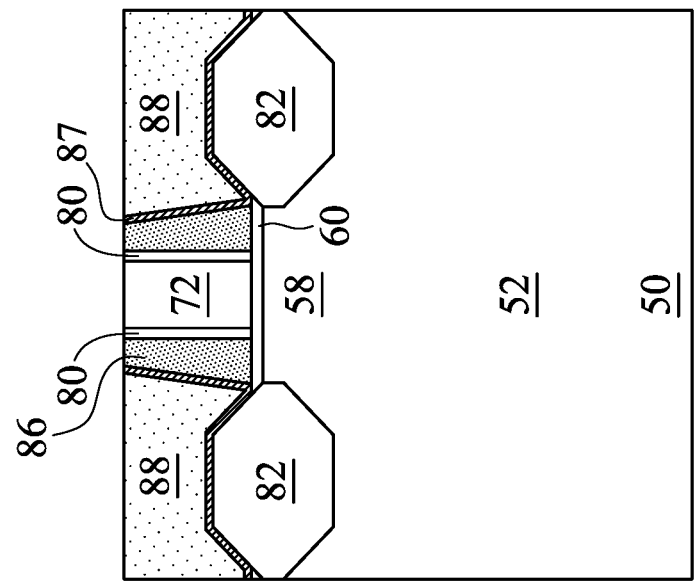
Figure 14A:
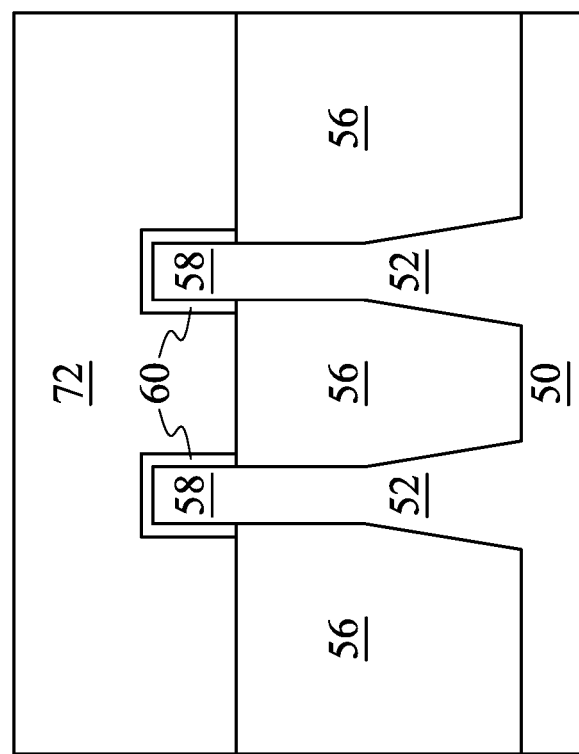

In FIGS. 14A and 14B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 15B:
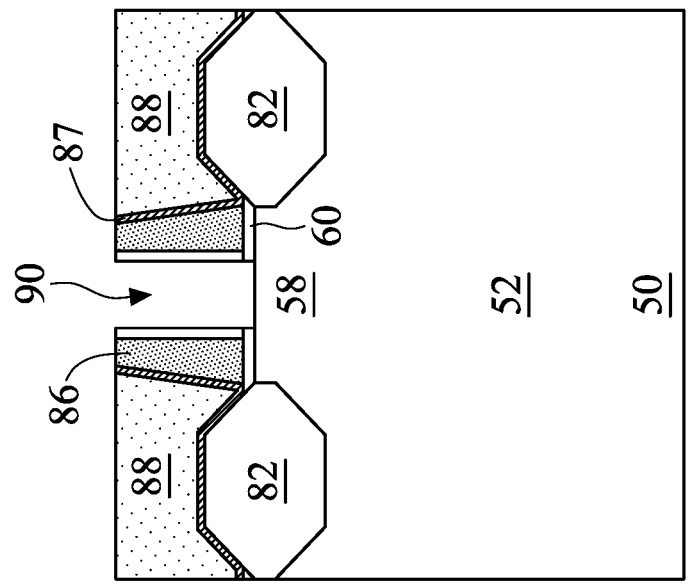
Figure 15A:
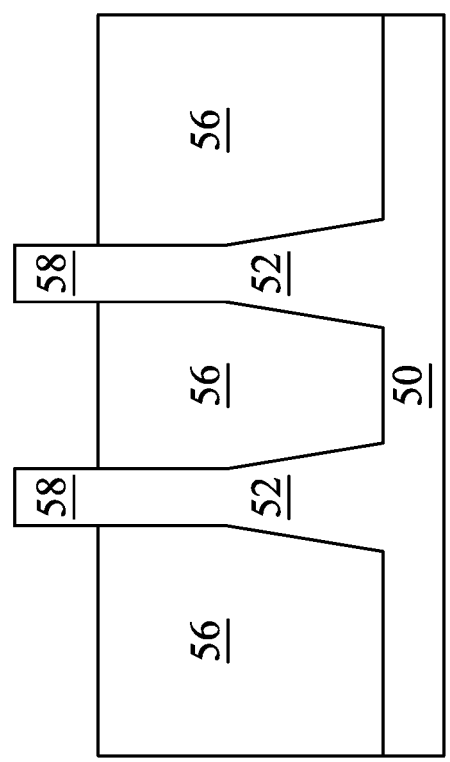

In FIGS. 15A and 15B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 16B:
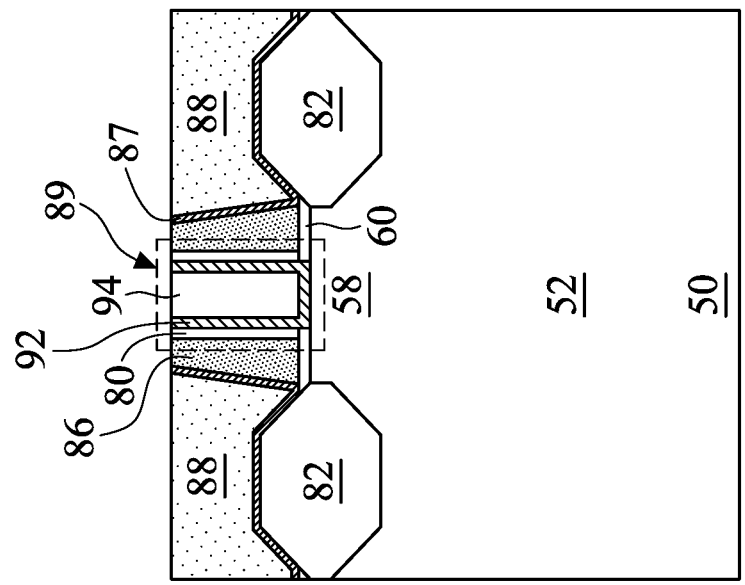
Figure 16A:
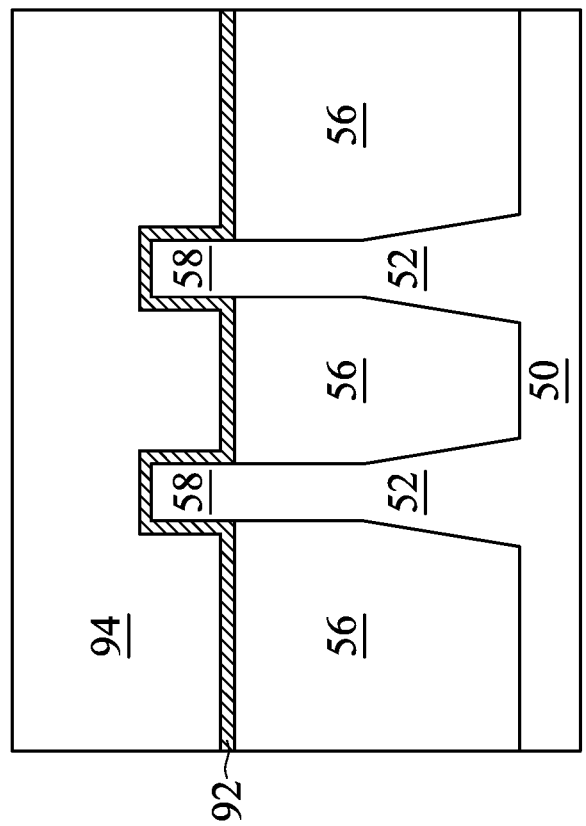
Figure 16C:
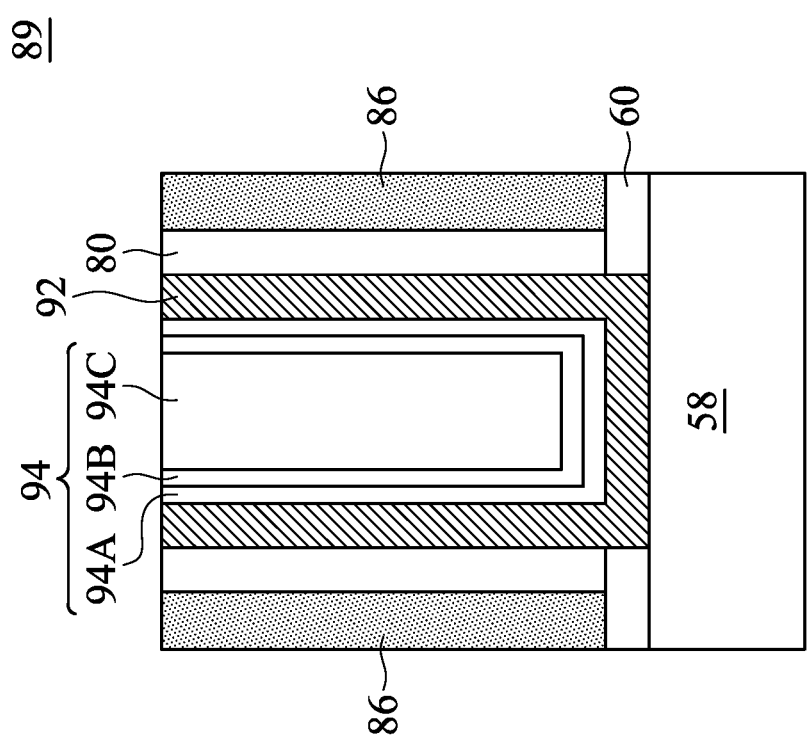

In FIGS. 16A and 16B, gate dielectric layers 92 and gate electrodes 94 are formed for replacement gates. FIG. 16C illustrates a detailed view of region 89 of FIG. 16B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy gate dielectric 60 (e.g., SiO$_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 16B, the gate electrode 94 may comprise any number of liner layers 94A, any number of work function tuning layers 94B, and a fill material 94C as illustrated by FIG. 16C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 17B:
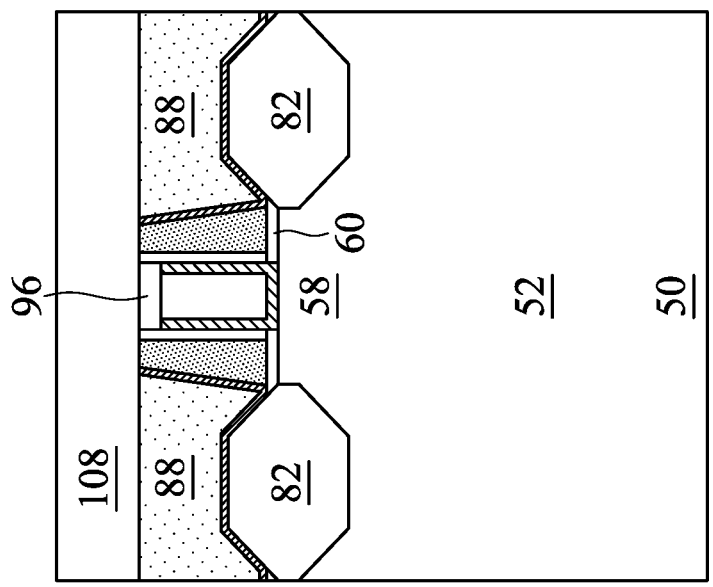
Figure 17A:
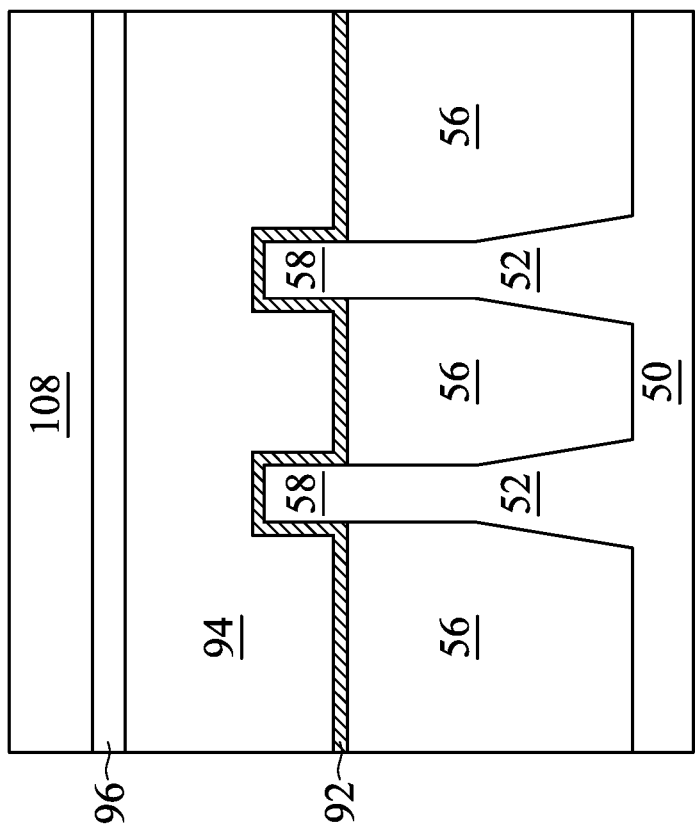

In FIGS. 17A and 17B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 17A and 17B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 18A and 18B) penetrate through the gate mask 96 to contact the top surface of the recessed gate electrode 94.

Figure 18B:
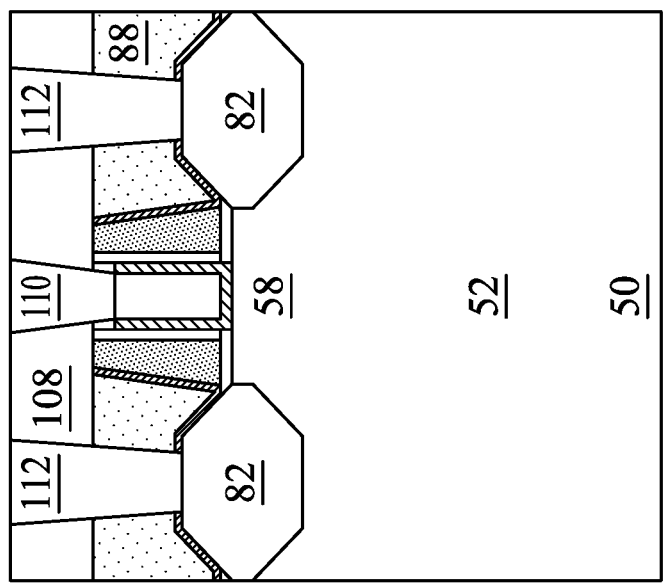
Figure 18A:
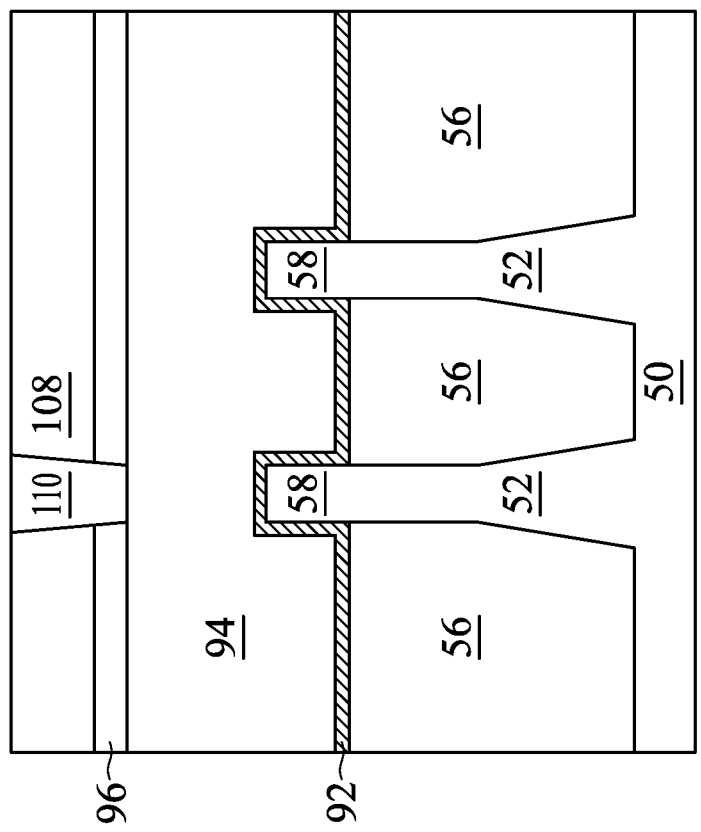

In FIGS. 18A and 18B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The embodiments described herein may achieve some advantages. By reducing the width of fins using the trimming process comprising an electron beam described herein, greater control over the width of the trimmed fin may be achieved. In some cases, by trimming the fins after formation of the STI regions, the roughness of the fins in the device may be reduced. By masking regions of the device during the trimming process, different regions of the device can have fins with different widths. The use of the trimming process described herein may also be less sensitive to loading effects or differences in fin composition.

In an embodiment, a method includes forming a fin on a substrate, forming an insulating material over the fin, recessing the insulating material to form an isolation region surrounding the fin, wherein an upper portion of the fin protrudes above the isolation region, performing a trimming process to reduce a width of the upper portion of the fin, and forming a gate structure extending over the isolation region and the upper portion of the fin. In an embodiment, performing the trimming process includes irradiating the upper portion of the fin with electrons. In an embodiment, the trimming process includes electrons having an energy between 0.5 keV and 10 keV. In an embodiment, irradiating the upper portion of the fin with electrons oxidizes the material of the upper portion of the fin to form an oxide. In an embodiment, the oxide has a thickness between 0.1 nm and 2.0 nm. In an embodiment, the material of the upper portion of the fin that is closer to the top of the fin is oxidized more than the material of the upper portion of the fin that is closer to the bottom of the fin. In an embodiment, the method includes removing the oxide. In an embodiment, after performing the trimming process, the upper portion of the fin has a tapered profile. In an embodiment, the upper portion of the fin includes silicon germanium. In an embodiment, the trimming process reduces the width of the upper portion of the fin between 20% and 50%.

In an embodiment, a method of forming a semiconductor device includes forming semiconductor fins protruding from a substrate, wherein each semiconductor fin has a first width, forming a Shallow Trench Isolation (STI) region between the semiconductor fins, and irradiating the semiconductor fins with an electron beam, wherein after irradiating the semiconductor fins, the semiconductor fins have a second width that is less than the first width. In an embodiment, irradiating the semiconductor fins with the electron beam includes scanning the electron beam across the semiconductor fins. In an embodiment, the electron beam is scanned across the semiconductor fins at least two times. In an embodiment, first semiconductor fins of the semiconductor fins have a first pitch, and second semiconductor fins of the semiconductor fins have a second pitch that is different than the first pitch. In an embodiment, first semiconductor fins of the semiconductor fins include silicon, and second semiconductor fins of the semiconductor fins include silicon germanium. In an embodiment, the second width is less than 80% of the first width.

In an embodiment, a method includes forming first semiconductor fins on a first region of a substrate and second semiconductor fins on a second region of a substrate, forming an isolation region surrounding the first semiconductor fins and surrounding the second semiconductor fins, forming a mask over the first region and the second region, patterning the mask to expose the first semiconductor fins of the first region, exposing the first semiconductor fins to an electron beam, and removing the mask, wherein after removing the mask the first semiconductor fins have a smaller width than the second semiconductor fins. In an embodiment, the first semiconductor fins include silicon, and the second semiconductor fins include silicon germanium. In an embodiment, exposing the first semiconductor fins to the electron beam oxidizes portions of the first semiconductor fins. In an embodiment, the method includes removing the oxidized portions of the first semiconductor fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first fin on a substrate;
    forming an insulating material adjacent the first fin, wherein a first portion of the first fin protrudes above the insulating material;
    irradiating the first portion of the first fin with electrons to form an irradiated layer, wherein an upper part of the first portion is irradiated with more electrons than a lower part of the first portion;
    removing the irradiated layer, remaining portions of the first fin forming a thinned fin; and
    after removing the irradiated layer, forming a gate structure extending over the insulating material and the thinned fin.

2. The method of claim 1, wherein the irradiating with electrons oxidizes sidewalls of the first portion.

3. The method of claim 1, wherein sidewalls of the thinned fin are tapered.

4. The method of claim 1, further comprising exposing the substrate to an oxygen gas while irradiating.

5. The method of claim 1, further comprising exposing the substrate to nitrogen, oxygen, or argon gas while irradiating.

6. The method of claim 1, wherein the irradiating is performed using a collimated electron beam scanned across the substrate.

7. The method of claim 1, wherein removing the irradiated layer comprises an etch process dilute hydrofluoric acid.

8. A method of forming a semiconductor device, the method comprising:
    forming a first fin and a second fin protruding from a substrate;
    forming an isolation region adjacent opposing sidewalls of the first fin and adjacent opposing sidewalls of the second fin, an exposed portion of first fin and an exposed portion of the second fin protruding above an upper surface of the isolation region;
    forming a mask over the exposed portion of the second fin;
    irradiating the exposed portion of the first fin with an electron beam while the mask is over the exposed portion of the second fin, wherein a thickness of an irradiated layer adjacent the isolation region is less than a thickness of the irradiated layer at a point further away from the isolation region;
    removing the irradiated layer to form a thinned fin;
    removing the mask; and
    forming a first gate over the thinned fin and forming a second gate over the second fin.

9. The method of claim 8, wherein the thinned fin and the second fin have different conductivities.

10. The method of claim 8, wherein a width of the thinned fin is different than a width of the second fin.

11. The method of claim 8, wherein a width of the thinned fin is in a range between 20% and 50% less than a width of the first fin.

12. The method of claim 8, wherein the electron beam has an energy between 0.5 keV and 10 keV.

13. The method of claim 12, wherein irradiating the first fin comprises irradiating the exposed portion of the first fin for a duration of time between 0.1 seconds and 2 seconds.

14. The method of claim 13, wherein irradiating forms an oxide layer having a thickness between 0.1 nm and 2.0 nm.

15. A method of forming a semiconductor device, the method comprising:
    forming a first semiconductor fin in a first region of a substrate and a second semiconductor fin in a second region of the substrate;
    forming an isolation region surrounding the first semiconductor fin and surrounding the second semiconductor fin, the first semiconductor fin and the second semiconductor fin protruding above the isolation region;
    forming a mask over the first semiconductor fin in the first region, wherein the second semiconductor fin in the second region is exposed;
    irradiating the second semiconductor fin with an electron beam to form an oxidized layer, wherein a first thickness of the oxidized layer adjacent the isolation region is less than a second thickness of the oxidized layer at a top of the second semiconductor fin;
    removing the oxidized layer;
    removing the mask, wherein after removing the mask and after removing the oxidized layer the first semiconductor fin has a greater width than the second semiconductor fin; and
    forming a first gate structure over the first semiconductor fin and a second gate structure over the second semiconductor fin.

16. The method of claim 15, wherein irradiating is performed by scanning the second semiconductor fin a plurality of times with the electron beam.

17. The method of claim 15, wherein, after removing the oxidized layer, the second semiconductor fin has an upper width between 3 nm and 7 nm and a lower width between 4 nm and 8 nm.

18. The method of claim 15, wherein the first semiconductor fin and the second semiconductor fin have different conductivity types.

19. The method of claim 18, wherein the first semiconductor fin comprises a first semiconductor material and wherein the second semiconductor fin comprises a second semiconductor material different than the first semiconductor material.

20. The method of claim 18, wherein a height of the first semiconductor fin is greater before irradiating the second semiconductor fin and removing the oxidized layer than after irradiating the second semiconductor fin and removing the oxidized layer.

* * * * *